(12) United States Patent
Fujita

(10) Patent No.: US 7,705,751 B2
(45) Date of Patent: Apr. 27, 2010

(54) ENCODER

(75) Inventor: Hiromasa Fujita, Hachioji (JP)

(73) Assignee: Olympus Corporation, Tokyo (JP)

( * ) Notice: Subject to any disclaimer, the term of this patent is extended or adjusted under 35 U.S.C. 154(b) by 31 days.

(21) Appl. No.: 12/247,649

(22) Filed: Oct. 8, 2008

(65) Prior Publication Data

US 2009/0096638 A1 Apr. 16, 2009

(30) Foreign Application Priority Data

Oct. 12, 2007 (JP) .............................. 2007-266769

(51) Int. Cl.
*M03M 1/22* (2006.01)
(52) U.S. Cl. .................. 341/13; 235/449; 702/158
(58) Field of Classification Search ............ 341/13–90; 235/449; 702/158
See application file for complete search history.

(56) References Cited

U.S. PATENT DOCUMENTS

| | | | | |
|---|---|---|---|---|
| 4,631,520 A * | 12/1986 | Wingate | ...................... | 341/13 |
| 4,912,468 A * | 3/1990 | Rust | ............................ | 341/119 |
| 6,002,923 A * | 12/1999 | Sahlman | ..................... | 455/118 |
| 6,377,784 B2 * | 4/2002 | McCune | ..................... | 455/108 |
| 6,816,016 B2 * | 11/2004 | Sander et al. | ............... | 330/295 |
| 7,072,626 B2 * | 7/2006 | Hadjichristos | .............. | 455/126 |
| 7,109,897 B1 * | 9/2006 | Levesque | ..................... | 341/67 |
| 7,256,712 B2 * | 8/2007 | Fujita | .......................... | 341/13 |
| 7,411,520 B2 * | 8/2008 | Fujita | ............................. | 341/7 |

FOREIGN PATENT DOCUMENTS

| | | |
|---|---|---|
| JP | 06-026817 | 2/1994 |
| JP | 2003-294489 | 10/2003 |
| JP | 2005-265695 | 9/2005 |
| JP | 2006-30059 | 2/2006 |
| JP | 2007-17339 | 1/2007 |
| WO | WO00/36659 | 6/2000 |

* cited by examiner

*Primary Examiner*—Lam T Mai
(74) *Attorney, Agent, or Firm*—Scully, Scott, Murphy & Presser, P.C.

(57) ABSTRACT

An encoder includes an encoder scale having an optical pattern of a prescribed cycle, and an encoder head configured to be displaced relative to the encoder scale. The encoder head includes a reference voltage generating circuit and a changing unit. The reference voltage generating circuit is configured to generate a reference voltage set to the center amplitude of an encoder signal when the output of the encoder is an encoder signal having periodicity of at least one phase. The changing unit is configured to change the reference voltage generated in the reference voltage generating circuit.

11 Claims, 5 Drawing Sheets

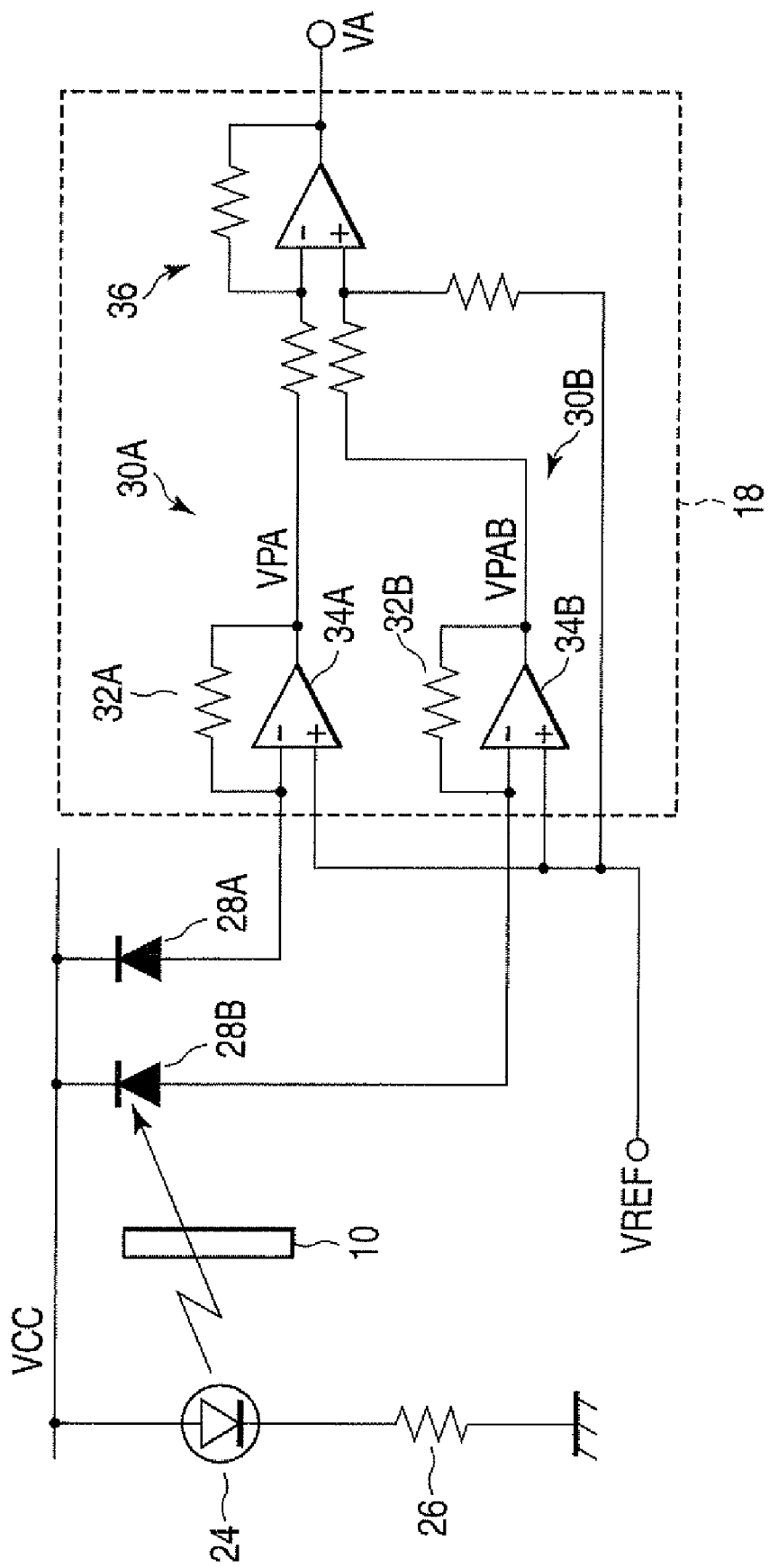
F I G. 2

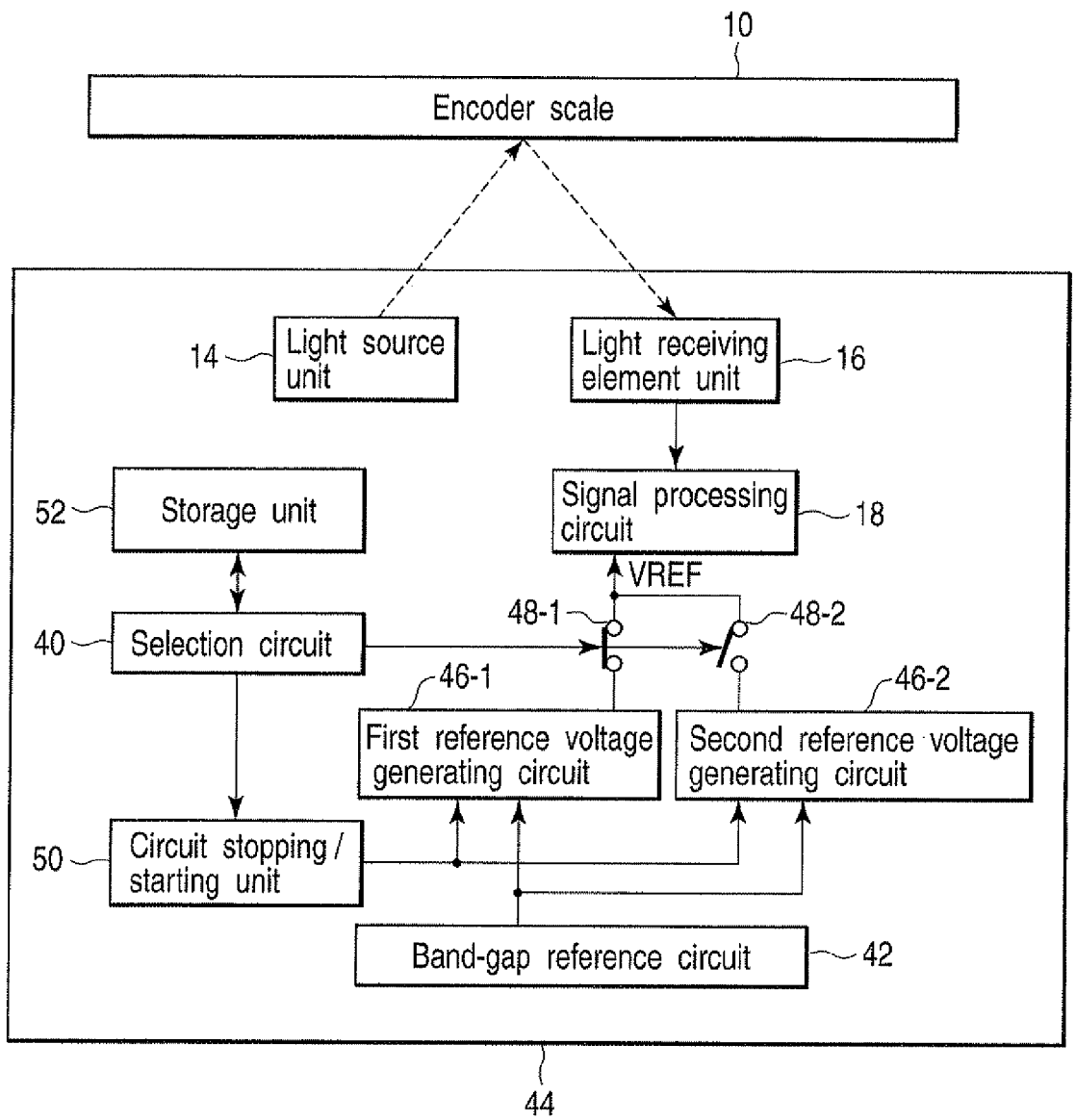
F I G. 5

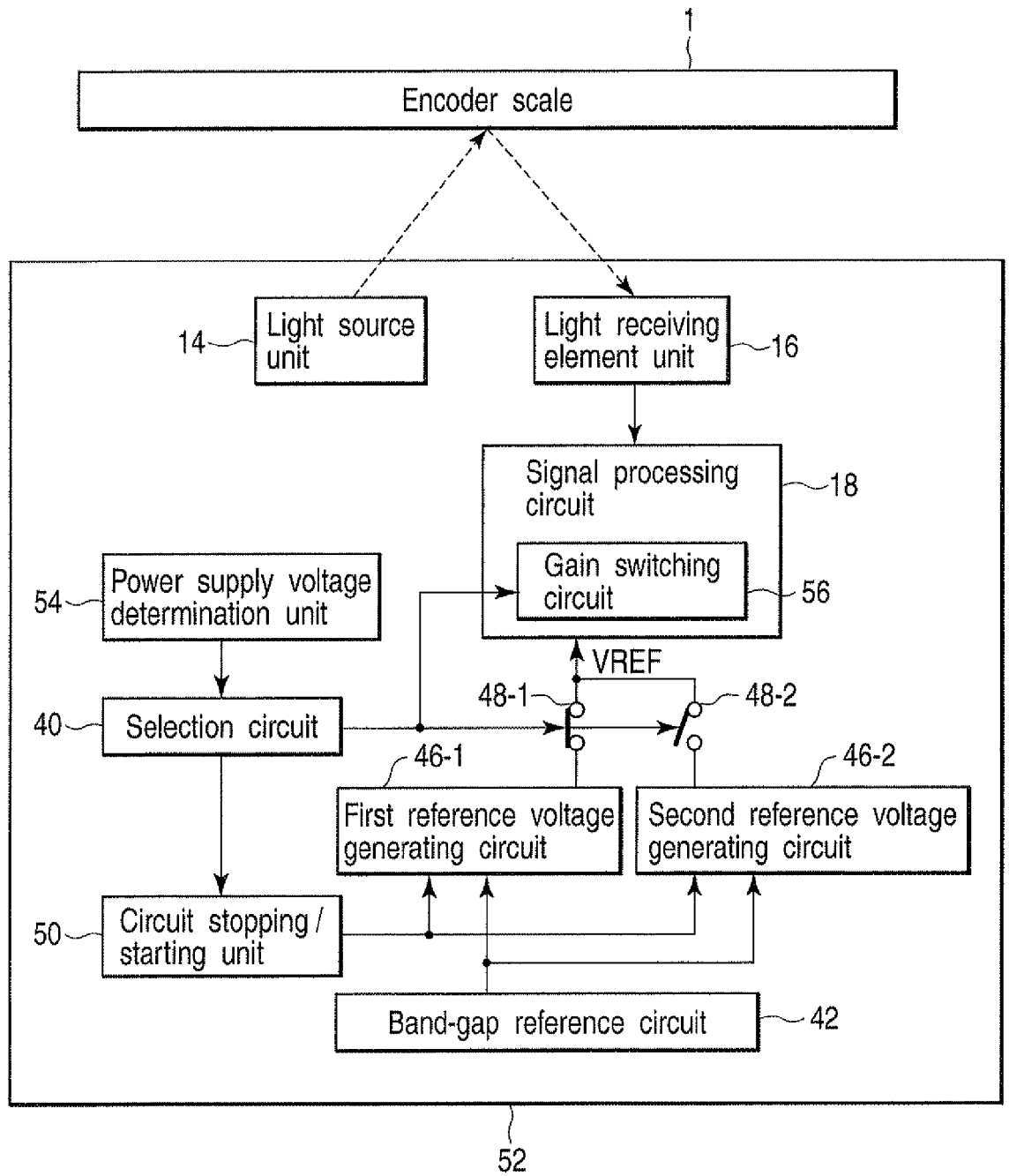
F I G. 6

ENCODER

CROSS-REFERENCE TO RELATED APPLICATIONS

This application is based upon and claims the benefit of priority from prior Japanese Patent Application No. 2007-266769, filed Oct. 12, 2007, the entire contents of which are incorporated herein by reference.

BACKGROUND OF THE INVENTION

1. Field of the Invention

The present invention relates to an encoder that detects a relative displacement between an encoder head and an encoder scale having a pattern of a prescribed cycle.

2. Description of the Related Art

Encoders are devices, each designed to generate a plurality of cyclic signals that are different in phase. The cyclic signals output from the encoder are supplied to a processing circuit which measures the cycle of each signal. From the cycles measured, the processing circuit can determine, for example, the moving direction of the object having an encoder scale is moving, the position of the object takes, the displacement of the object, and the displacement speed of the object.

An encoder configured to detect the displacement a relative displacement between an encoder head an encoder scale having a prescribed cyclic optical pattern is disclosed in, for example, Jpn. Pat. Appln. No. 6-26817. In the encoder, the light emitted from the light source mounted on the encoder head is applied to the encode scale that is moving relative to the encoder head. The light reflected, diffracted or scattered at the encoder scale is guided to a plurality of light receiving elements provided on the encoder head. Assume that the light is guided to two light receiving elements arranged with a phase difference of 180 between them. Then, the photoelectric currents the light receiving elements have generated are input to the current-to-voltage conversion circuit incorporated in the encoder. The current-to-voltage conversion circuit converts the photoelectric currents into voltage signals VPA and VPAB, respectively. Each of the voltage signals VPA and VPAB contains not only the AC component representing the change in the intensity of light coming from the encoder scale, but also the DC component representing the fixed intensity of the light and the noise contained in the voltage signal. The noises contained in the voltage signals VPA and VPAB, respectively, are equal to each other. In order to remove the DC components and the noises from the voltage signals VPA and VPAB, the subtraction circuit provided in the encoder performs an operation of: VREF−(VPAB−VPA), where VREF is a reference voltage. The subtraction circuit generates a cyclic signal VA that represents the change in light intensity only. The reference voltage VREF is a fixed voltage that has been generated by dividing the power supply voltage VCC. The reference voltage VREF is applied to the current-to-voltage conversion circuit and subtraction circuit. The reference voltage VREF is used as the reference level of cyclic signals.

The encoder has a plurality of units, each composed two light receiving elements and a signal processing circuit. These units generate cyclic signals of different phases, which are used as an encoder signal. The encoder can divide the phases of two cyclic signals that differ in phase by, for example, 90°, each into tens to thousands of segments. This enables the encoder to detect, at a higher precision, the relative displacement of the encoder head and the encoder scale.

Hitherto, the AC component and the DC component are supplied to the two current-to-voltage conversion circuits associated with the two light receiving elements and are converted to voltage signals. Thereafter, the subtraction circuit subtracts one of the two voltage signals differing in phase by 180° from the other voltage signal, thereby eliminating the DC component contained in the same amount in the two voltage signals. To obtain the encoder signal that contains a little noise and greatly changes in voltage, each current-to-voltage conversion circuit should better generate a sufficiently large voltage signal and the subtracting circuit should not amplify the signal so much.

In order to miniaturize the encoder, reduce the price of the encoder and lower the power supply voltage of the encoder, the light source, the light receiving elements and a IC comprising the light source driver and signal processing circuit may be encapsulated in a transparent resin mass and mounted on the encoder head (the light receiving elements may be incorporated in the IC.) If the encoder is so configured, however, an DC component resulting from the light reflected and scattered in the resin mass and not changing in magnitude, irrespective of the relative displacement of the light receiving elements and the encoder scale, will be more generated than hitherto, in addition to the AC component and DC component that has resulted from the light reflected, diffracted or scattered at the encoder scale. In such a conventional encoder, the DC component not contributing to the encoder signal is so large that the current signal corresponding to the AC component generated by each light receiving element cannot be converted into a voltage signal having sufficient amplitude by the current-to-voltage conversion circuit, which should be supplied to the next-stage circuit. Further, the voltage signal may have a voltage falling outside the output range of the current-to-voltage conversion circuit, and no signals may be supplied to the next-state circuit. These problems are particularly prominent if the power supply voltage VCC is low. Moreover, such the encoder signal has an insufficient amplitude or an insufficient signal-to-noise ratio even if its phase angle is determined from its amplitude and then multiplied in accordance with the phase angle. Inevitably, the encoder cannot detect the displacement at high precision.

The problem resulting from the low power supply voltage arises not only in reflection-type encoders, but also in transmission-type encoders.

BRIEF SUMMARY OF THE INVENTION

The present invention has been made In view of the foregoing. An object of the invention is to provide an encoder that can be used at low voltage and can detect displacement at so high precision as desired, even in an encoder wherein the signal generated by each light receiving element has a relatively large DC component that does not contribute to an encoder signal.

According to an aspect of the present invention, there is provided an encoder comprising:

an encoder scale having an optical pattern of a prescribed cycle; and an encoder head configured to be displaced relative to the encoder scale, the encoder head including:

a reference voltage generating circuit configured to generate a reference voltage set to the center amplitude of an encoder signal when the output of the encoder is an encoder signal having periodicity of at least one phase; and a changing unit configured to change the reference voltage generated in the reference voltage generating circuit.

The present invention can provide an encoder so configured that the reference voltage can be changed, which is the center voltage of the cyclic encoder signal that an encoder head outputs based on the displacement the encoder head has relative to the encoder scale having a prescribed cyclic pattern. Hence, the encoder can set an appropriate reference voltage not only in the case where it is used at low voltage, but also in the case where it is used to detect the replacement at high precision. In other words, the encoder according to the invention can well copes with both cases.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a diagram showing that section of a signal processing circuit, which generates an A-phase cyclic signal of an encoder signal;

FIG. 5 is a diagram showing the configuration of an encoder according to a third embodiment of the invention; and FIG. 6 is a diagram showing the configuration of an encoder according to a fourth embodiment of the present invention.

DETAILED DESCRIPTION OF THE INVENTION

The best modes for carrying out the present invention will be described with reference to the accompanying drawings.

First Embodiment

Figure 1:
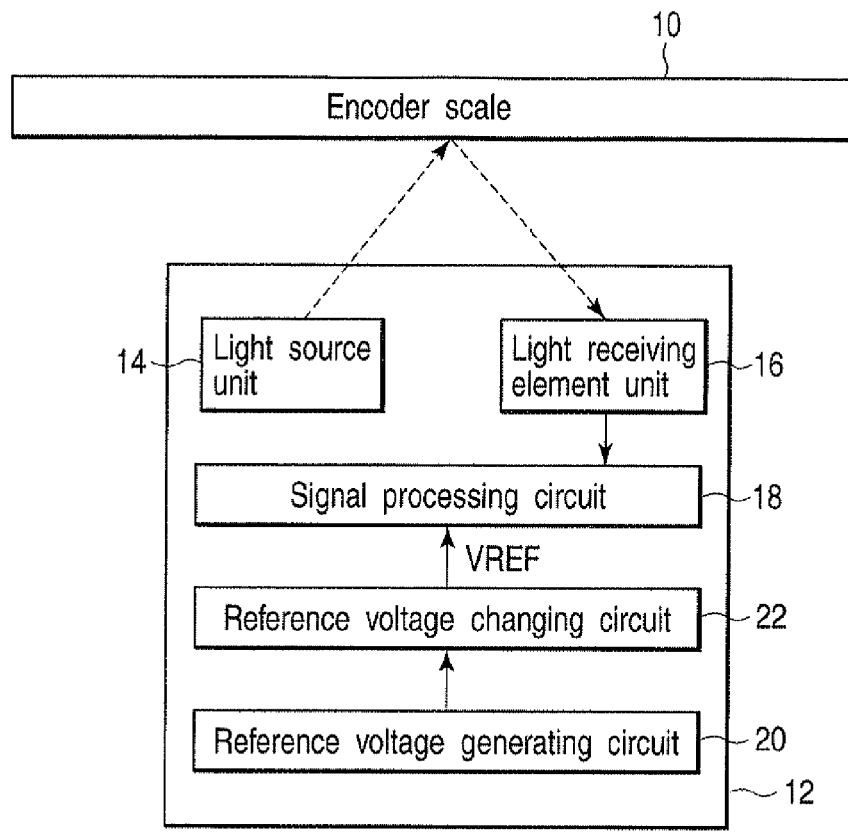
FIG. 1 is a diagram showing the configuration of an encoder according to a first embodiment of the present invention.

As shown in FIG. 1, an encoder according to the first embodiment of this invention is a refractive-type encoder. The encoder comprises an encoder scale 10 and an encoder head 12. The encoder scale 10 and the encoder head 12 move relative to each other.

Although not shown in FIG. 1, a prescribed cyclic optical pattern is formed on the encoder scale 10.

The encoder head 12 holds a light source unit 14, a light receiving element unit 16, a signal processing circuit 18, a reference voltage generating circuit 20, and a reference voltage changing circuit 22. The light source unit 14 includes interferential light sources.

As shown in FIG. 2, the light source unit 14 of the encoder head 12 comprises a light source 24, and a resistor 26. The resistor 26 is connected to the light source 24 in serials, determining the voltage applied to the light source 24. The light emitted from the light source 24 is reflected, diffracted or scattered at the encoder scale 10, reaching the encoder head 12. The light is then applied to the light receiving element unit 16. That is, the light guided to the encoder head 12 is changed in amount due to the relative displacement of an encoder head and an encoder scale. The light receiving element unit 16 detects this change in the amount of the light. The light receiving element unit 16 has pairs of light receiving elements. Each light receiving element generates a photoelectric current signal that representing the amount of the light the element has received. The signal processing circuit 18 converts the photoelectric current signals generated by the pairs of light receiving elements, into an encoder signal having different phases. The encoder signal constitutes an output signal of the encoder head 12.

For obtaining an A-phase cyclic signal, the light receiving element unit 16 may have, for example, a pair of light receiving elements 28A and 28B that differ in phase by 180° from each other as is illustrated in FIG. 2. The photoelectric current signal the light receiving element 28A generates is input to a current-to-voltage conversion circuit 30A, which comprises a resistor 32A and operation amplifier 34A. The current-to-voltage conversion circuit 30A converts the photoelectric current signal into a voltage signal VPA. Similarly, the photoelectric current the light receiving element 28B generates is input to a current-to-voltage conversion circuit 30B, which comprises a resistor 32B and operation amplifier 34B. The current-to-voltage conversion circuit 30B converts the photoelectric current output by the element 28B into a voltage signal VPAB. Each of the voltage signals VPA and VPAB includes not only an AC component (i.e., a component representing an intensity change of the light from the encoder scale 10), but also DC component (i.e., a component representing the light which has a constant intensity) and noise. Note that the noise in the voltage signal VPA is equal to the noise in the voltage signal VPAB. To remove the DC component and the noise from each voltage signal, a subtraction circuit 36 performs subtraction of: VREF−(VPAB−VPA), where VREF is reference voltage generated in the reference voltage generation circuit 20. The reference voltage VREF is varied by the reference voltage changing circuit 22 and then supplied, as will be described later.

Thus, a cyclic signal VA is obtained, whose sole component is a change in light intensity. The encoder, which has pairs of light receiving elements, generates a plurality of cyclic signals of different phases, which are output as an encoder signal.

The encoder may divide the phase difference between the two cyclic signals of phases (e.g., phase A and phase B) that differ by 90°, into tens to thousands of segments, thereby to detect the change in light intensity more minutely.

The signal processing circuit 18 may include a circuit for applying a given gain, as will be described in connection with a fourth embodiment of this invention.

Figure 3:
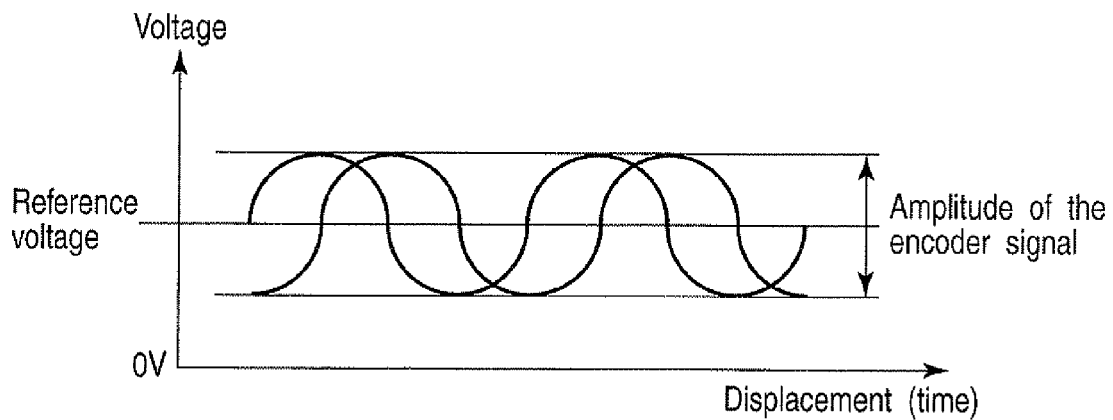
FIG. 3 is a waveform diagram explaining the encoder signal.

The cyclic signals the encoder head 12 (more precisely, signal processing circuit 18) outputs are such quasi-sine-wave signals as shown in FIG. 3. The quasi-sine-wave signals having a phase difference of 90° of FIG. 3 are a 2-phase encoder signal. The center voltage (amplitude) of the cyclic encoder signal is equal to the reference voltage VREF. The reference voltage VREF has been generated by the reference voltage changing circuit 22, which changes the prescribed voltage generated by the reference voltage generation circuit 20. The reference voltage VREF generated by the reference voltage changing circuit 22 is applied to the signal processing circuit 18 and is used as the reference voltage for the encoder signal, i.e., the output signal of the encoder head 12, or as the reference voltage for the current-to-voltage conversion circuits 30A and 30B. This reference voltage may be used to drive the circuit (not shown) that in turn drives the light source 24.

The reference voltage generation circuit 20 may be provided outside the encoder head 12, not in the encoder head 12 as described above. In this case, the voltage the circuit 20 generates is applied to the encoder 12.

In the above-described configuration, the reference voltage changing circuit 22 changes the reference voltage VREF when the current-to-voltage conversion circuits 30A and 30B coverts, into voltage signals, the signals output by the light receiving element unit 16 and representing the relative displacement between the encoder scale 10 and the encoder head 12. The value by which reference voltage changing circuit 22 changes the reference voltage VREF is determined from the signal components not depending on the displacement, the signal components depending on the displacement, and the input/output range tolerance allowing the current-to-voltage conversion circuits 30A and 30B to operate irrespective of the power supply voltage VCC. The encoder head 12 can therefore output an appropriate encoder signal that servers the purpose.

Resolution as high as quarter (¼) cycle of the encoder signal that is a cyclic signal must be obtained, and the power supply voltage VCC should yet be lowered as much as possible. In such a case, the reference voltages for the current-to-voltage conversion circuits 30A and 30B are set to such values that the circuits 30A and 30B may have a maximum operating range, and the reference voltage of the encoder signal is set to about half (½) the power supply voltage VCC. Then, a signal much larger than the noise can be attained, even at a low power supply voltage VCC.

It may be desired that the resolution should be divided into thousands of segments of the encoder signal cycle and the segment signals thus obtained should be set at more regular intervals, thereby to improve the linearity, though the power supply voltage VCC remains not set. In such a case, the power supply voltage VCC may be set to such an appropriate value that the setting the reference voltages of the current-to-voltage conversion circuits 30A and 30B and the reference voltage of the encoder signal may become about half (½) the power supply voltage VCC. Alternatively, the reference voltage for the encoder signal may be set to about the center voltage of the circuit that receives the encoder signal.

Voltage about half (½) the power supply voltage VCC can be attained by providing resistors each having the same resistance and connected in series, between the power supply voltage VCC and the ground (GND). This method, however, should not be employed, because it may impose the noise, ripple or change in the power supply on the encoder signal.

In the first embodiment described above, the reference voltage VREF, i.e., the center voltage, can be changed in the cyclic encoder signal that the encoder head 12 has output based on the relative displacement between the encoder scale 10, which has a prescribed cyclic pattern, and the encoder head 12. This makes it possible to determine the performance of the encoder if the reference voltage can have at least two values (potentials) regarding the power supply voltage VCC for driving the encoder head 12. Hence, even if the encoder head is one which uses a relatively low power supply voltage VCC, it can be used as an encoder head that can output an encoder signal of quasi-sine waveform, which has a high signal-to-noise ratio and little distortion, which can undergo phase division at high resolution, and which consists of segment set at more regular intervals and therefore has high linearity.

Thus, the present embodiment can provide an encoder that may be used in various cases, not only in the case where the power supply voltage VCC is low and the resolution is low, but also in the case where high resolution should be achieved.

Second Embodiment

Figure 4:
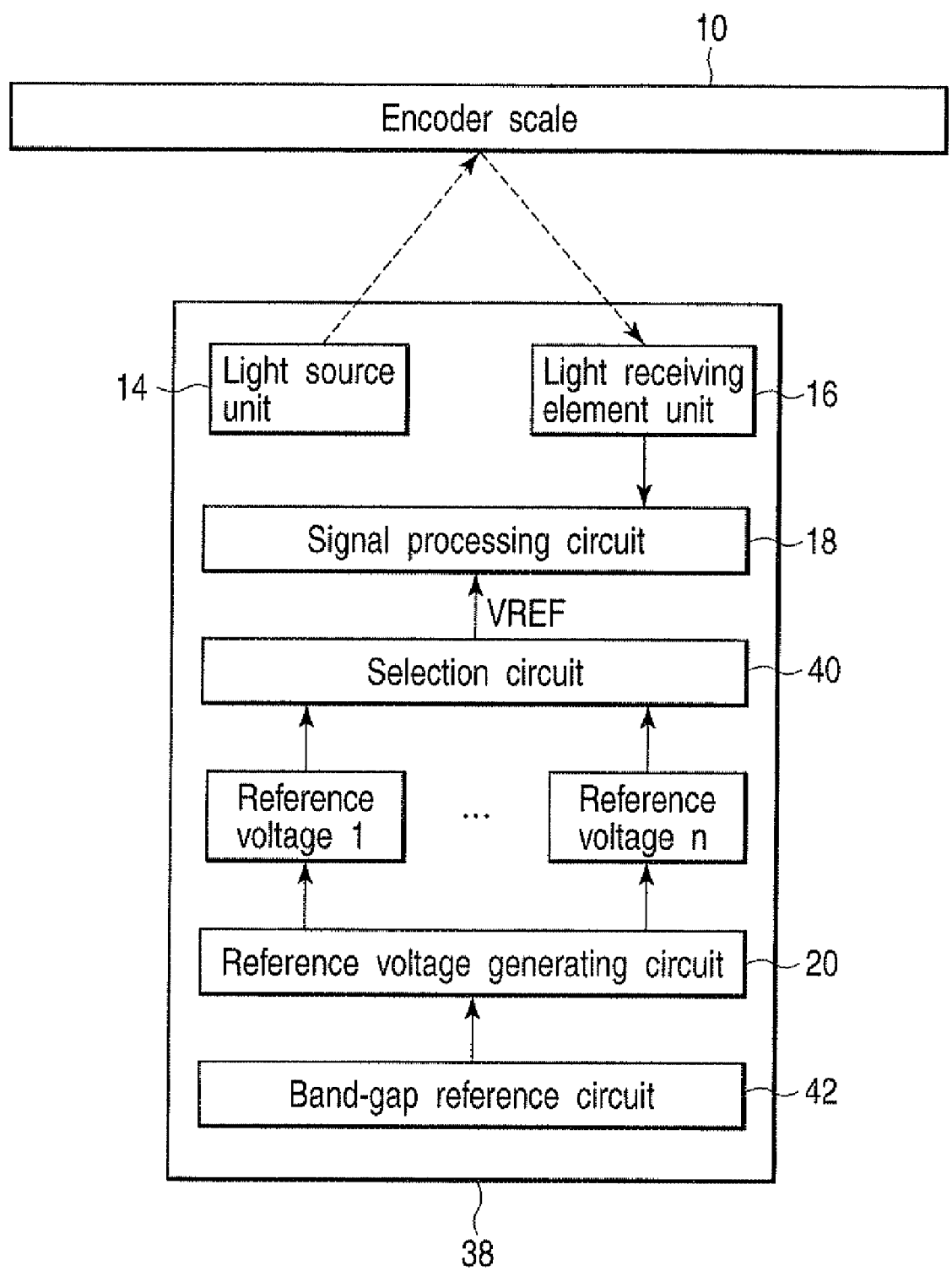
FIG. 4 is a diagram showing the configuration of an encoder according to a second embodiment of the present invention.

A second embodiment of this invention will be described with reference to FIG. 4. FIG. 4 is a diagram showing the configuration of an encoder according to the second embodiment of the invention. The components identical to those shown in FIG. 1 are designated by the same reference numbers and will not be described.

The encoder according to this embodiment comprises an encoder scale 10 and an encoder head 38. The encoder head 38 may be displaced relative to the encoder scale 10 having a prescribed cycle optical pattern. The encoder head 38 comprises a light source unit 14, a light receiving element unit 16, a signal processing circuit 18, a reference voltage generating circuit 20, a selection circuit 40, and a band-gap reference circuit 42.

In the present embodiment, the reference voltage generating circuit 20 generates a plurality of reference voltages (reference voltages 1, 2, 3, . . . , n), and the selection circuit 40 selects one of these reference voltages in accordance with the use state of the encoder head. The reference voltage selected is applied to the signal processing circuit 18. Note that the selection circuit 40 is set in accordance with an instruction coming from outside the encoder head 38.

The band-gap reference circuit 42 is a circuit that is configured to generate a constant voltage that is little influenced by changes in the power supply voltage VCC or changes in the temperature. The voltage the band-gap reference circuit 42 can generate is almost constant, irrespective of the changes in the power supply voltage VCC and the changes in the temperature. The reference voltage generating circuit 20 is configured to utilize such almost constant voltage output from the band-gap reference circuit 42. In the second embodiment described above, the reference voltages can be set for various states in which the encoder head may be used. Further, the setting can be selected in accordance with the use state of the encoder head. Therefore, the encoder can be used in any one of various ways, in accordance with the purpose for which the user uses the encoder.

The selection circuit 40 can select one of the above-mentioned reference voltages (reference voltages 1, 2, 3, . . . , n), as the reference voltage VREF of the encoder signal. The reference voltages necessary at some components, such as current-to-voltage conversion circuits 30A and 30B and the circuit (not shown) that drives the light source 24, may be selected, in combination, by selection circuit 40 in accordance with the use state of the encoder head.

In FIG. 4, only one reference voltage generating circuit 20 is illustrated. Nonetheless, two or more reference voltage generating circuits may of course be provided.

Third Embodiment

A third embodiment of this invention will be described with reference to FIG. 5. FIG. 5 is a diagram showing the configuration of an encoder according to the third embodiment of the invention. The components identical to those shown in FIGS. 1 and 4 are designated by the same reference numbers and will not be described.

The encoder according to this embodiment comprises an encoder scale 10 and an encoder head 44. The encoder head 44 can be displaced relative to the encoder scale 10 having a prescribed cycle optical pattern. The encoder head 44 comprises a light source unit 14, a light receiving element unit 16, a signal processing circuit 18, a reference voltage generating circuit 20, a selection circuit 40, a band-gap reference circuit 42, a first reference voltage generating circuit 46-1, a second reference voltage generating circuit 46-2, switches 48-1 and 48-2, a circuit stopping/starting unit 50, and a storage unit 52.

In this embodiment, two circuits are provided to generate reference voltages. They are a first reference voltage generating circuit 46-1 and a second reference voltage generating circuit 46-2. The selection circuit 40 selects one of the reference voltage generating circuits 46-1 and 46-2, before any reference voltage is applied to the signal processing circuit 18. The switch 48-1 is connected between the signal processing circuit 18 and the first reference voltage generating circuit 46-1. The switch 48-2 is connected between the signal processing circuit 18 and the second reference voltage generating circuit 46-2. The switches 48-1 and 48-2 are complementarily operated, one selected while the other not selected by the selection circuit 40.

The circuit stopping/starting unit 50 interrupts the supply of power to one of the first and second reference voltage generating circuits 46-1 and 46-2, which is not used. This can reduce the power consumption. The circuit stopping/starting unit 50 operates in accordance with an instruction coming from the selection circuit 40.

The data representing which switch, switch 48-1 or switch 48-2, the selection circuit 40 has selected, is stored in the storage unit 52. In accordance with this data stored in the storage unit 52, the switch 48-1 or 48-2 and the circuit stopping/starting unit 50 are operated. The storage unit 52 may be an electronic memory. Alternatively, the storage unit 52 may be constituted by connecting terminals physically with electrically conductive members such as bonding wires, bumps or sliver past masses. In whichever way it is fabricated, the storage unit 52 achieves the same advantage.

Note that the selection circuit 40 operates in response to an instruction coming from outside the encoder head 44.

In the third embodiment described above, reference voltages can be set for various states in which the encoder head may be used, and the setting can be selected in accordance with the use state of the encoder head. Therefore, the encoder can be used in any one of various ways, in accordance with the purpose for which the user uses the encoder.

Since no power is supplied to one of the first and second reference voltage generating circuits 46-1 and 46-2, which is not used, the power consumption can be reduced. Moreover, the use of the encoder head 44 can be set when the method of using the encoder is set, because the storage unit 52 stores the data representing which switch the selection circuit 40 has selected, switch 48-1 or switch 48-2. Therefore, the encoder can be utilized without setting by the user.

As pointed out above, the storage unit 52 may be an electronic memory. In this case, the data stored in the storage unit 52 can be rewritten. By contrast, if the storage unit 52 is constituted by connecting terminals physically, it can reliably store the data representing which switch the selection circuit 40 has selected.

Furthermore, the switches 48-1 and 48-2 can reliably switch the reference voltage, from one to the other.

As FIG. 5 shows, the encoder head 44 according to the third embodiment has two reference voltage generating circuits and two switches. The number of reference voltage generating circuits and that of the switches are not limited to two. The encoder head 44 may have as many reference voltage generating circuits and switches as desired.

Fourth Embodiment

A fourth embodiment of this invention will be described with reference to FIG. 6. FIG. 6 is a diagram showing the configuration of an encoder according to the fourth embodiment of the invention. The components identical to those shown in FIGS. 1, 4 and 5 are designated by the same reference numbers and will not be described.

The encoder according to this embodiment comprises an encoder scale 10 and an encoder head 52. The encoder head 52 may be displaced relative to the encoder scale 10 having a prescribed cycle optical pattern. The encoder head 52 comprises a light source unit 14, a light receiving element unit 16, a signal processing circuit 18, a selection circuit 40, a band-gap reference circuit 42, a first reference voltage generating circuit 46-1, a second reference voltage generating circuit 46-2, switches 48-1 and 48-2, a circuit stopping/starting unit 50, and a power supply voltage determination unit 54. The signal processing circuit 18 has a gain switching circuit 56 that imparts a prescribed gain to the encoder signal in the signal processing circuit 18.

The power supply voltage determination unit 54 is configured to determine the power supply voltage VCC applied to the encoder head 52 in at least two values. The values are, for example, 3 and 5V. The gain switching circuit 56 is configured to change the amplitude of the encoder signal in accordance with the reference voltage that the selection circuit 40 has set for the encoder signal.

In the fourth embodiment so configured as described above, the encoder head 52 can use one of at least reference voltages that have been preset, if the user of the encoder only applies a power supply voltage VCC to the encoder. In accordance with the reference voltage used, the encoder signal can acquire optimum amplitude.

Assume that the reference voltage of 3V is applied to the encoder head 52, whereby the resolution or the linearity can be sacrificed. In this case, the selection circuit 40 selects the first reference voltage generating circuit 46-1, which generates a reference voltage of about 1.5V. At the same time, the selection circuit 40 causes the gain switching circuit 56 to select such a small gain that the encoder head 52 may output an encoder signal having a amplitude of about 1 VPP.

The reference voltage of 5V may be applied to the encoder head 52, whereby either the resolution or the linearity can be ensured. In this case, the selection circuit 40 selects the second reference voltage generating circuit 46-2, which generates a reference voltage of about 2.5V. At the same time, the selection circuit 40 causes the gain switching circuit 56 to select such a prescribed gain that the encoder head 52 may output an encoder signal having a amplitude of about 3 VPP.

The first to fourth embodiments of this invention have been described. The present invention is not limited to the embodiments, nevertheless. Various changes and modifications can be, of course, made within the scope and spirit of the invention.

For example, any embodiment described above can achieve basically the same advantage, even if it does not use at least one component or even if it has at least one component of any other embodiment, as an additional component.

The encoder heads 12, 38, 44 and 52 may be a combination of such components as can be fabricated on the same semiconductor substrate. Then, they can be each a very small encoder head that is inexpensive and can serve various purposes.

The embodiments described above are reflection-type encoders. Nonetheless, the present invention can be applied to a transmission-type encoder in which the light source 14 and the light receiving element unit 16 oppose each other across the encoder scale 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An encoder comprising:
    an encoder scale having an optical pattern of a prescribed cycle; and
    an encoder head configured to be displaced relative to the encoder scale, wherein
    the encoder head including:
        a reference voltage generating circuit configured to generate a reference voltage set to the center amplitude of an encoder signal when an output of the encoder is the encoder signal having periodicity of at least one phase; and
        a changing unit configured to change the reference voltage generated in the reference voltage generating circuit.

2. The encoder according to claim 1, wherein
    the reference voltage generating circuit is configured to generate a plurality of reference voltages, and
    the changing unit includes a selection unit configured to select one of the pluralities of reference voltages.

3. The encoder according to claim 1, wherein the reference voltage generating circuit includes a band-gap reference circuit configured to generate a constant voltage and is configured to generate a plurality of reference voltages based on the constant voltage generated by the band-gap reference circuit.

4. The encoder according to claim 2, wherein the changing unit includes a switch configured to select one of the pluralities of reference voltages in accordance with the selection of the selection unit.

5. The encoder according to claim 2, wherein
    the changing unit further includes a determination unit configured to determine the value of a power supply voltage, and
    the selection unit is configured to select one of the voltages in accordance with the power supply voltage determined by the determination unit.

6. The encoder according to claim 4, wherein
    the changing unit further includes a storage unit configured to store a switch setting of the switch, and
    the selection unit is configured to changing over the switch in accordance with the setting of the switch setting stored in the storage unit.

7. The encoder according to claim 6, wherein the storage unit is configured to store the switch setting electrically.

8. The encoder according to claim 6, wherein the storage unit is configured to store the switch setting by using a physical circuit connection.

9. The encoder according to claim 1, wherein the encoder head further includes a gain switching unit configured to change the amplitude of the encoder signal having periodicity of at least one phase, as the reference voltage is changed.

10. The encoder according to claim 2, wherein
    the reference voltage generating circuit includes a plurality of voltage generating units for generating the plurality of reference voltages, and
    the encoder head further includes a circuit stopping/starting unit configured to stop and start those of the voltage generating units, which generate reference voltages not selected by the selection unit.

11. The encoder according to claim 1, wherein the encoder head is constituted by a semiconductor circuit.

* * * * *